US007075150B2

(12) United States Patent
Boyd et al.

(10) Patent No.: US 7,075,150 B2
(45) Date of Patent: Jul. 11, 2006

(54) ULTRA-THIN SI CHANNEL MOSFET USING A SELF-ALIGNED OXYGEN IMPLANT AND DAMASCENE TECHNIQUE

(75) Inventors: Diane C. Boyd, LaGrangeville, NY (US); Bruce B. Doris, Brewster, NY (US); Meikei Ieong, Wappingers Falls, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/725,849

(22) Filed: Dec. 2, 2003

(65) Prior Publication Data

US 2005/0116289 A1    Jun. 2, 2005

(51) Int. Cl.
*H01L 27/01* (2006.01)
(52) U.S. Cl. .................. 257/347; 257/507; 257/E27.01
(58) Field of Classification Search ................ 257/347, 257/349, 524, 507
See application file for complete search history.

(56) References Cited

U.S. PATENT DOCUMENTS 5,959,331 A * 9/1999 Hsu et al. .................... 257/349
6,010,921 A * 1/2000 Soutome ...................... 438/151
6,064,092 A * 5/2000 Park ............................. 257/347
6,437,404 B1   8/2002 Xiang et al. ................. 257/347
6,479,866 B1 * 11/2002 Xiang .......................... 257/347
6,531,741 B1 * 3/2003 Hargrove et al. ........... 257/350

* cited by examiner

*Primary Examiner*—T. N. Quach
(74) *Attorney, Agent, or Firm*—Scull, Scott, Murphy & Presser, P.C.; Robert M. Trepp, Esq.

(57) ABSTRACT

The present invention provides a thin channel MOSFET having low external resistance. In broad terms, a silicon-on-insulator structure comprising a SOI layer located atop a buried insulating layer, said SOI layer having a channel region which is thinned by the presence of an underlying localized oxide region that is located on top of and in contact with said buried insulating layer; and a gate region located atop said SOI layer, wherein said localized oxide region is self-aligned with the gate region. A method for forming the inventive MOSFET is also provided comprising forming a dummy gate region atop a substrate; implanting oxide forming dopant through said dummy gate to create a localized oxide region in a portion of the substrate aligned to the dummy gate region that thins a channel region; forming source/drain extension regions abutting said channel region; and replacing the dummy gate with a gate conductor.

15 Claims, 6 Drawing Sheets

ULTRA-THIN SI CHANNEL MOSFET USING A SELF-ALIGNED OXYGEN IMPLANT AND DAMASCENE TECHNIQUE

FIELD OF THE INVENTION

The present invention relates to semiconductor devices and methods of manufacture, and more particularly to a method for manufacturing an improved metal oxide semiconductor (MOS) transistor having an ultra-thin channel (on the order of about 50 nm or less).

BACKGROUND OF THE INVENTION

Field effect transistors (FETs) are the basic building block of today's integrated circuits (ICs). Such transistors can be formed in conventional bulk semiconductor substrates (such as silicon) or in the SOI layer of a silicon-on-insulator (SOI) substrate.

In order to be able to make ICs, such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device, while maintaining the device's electrical properties. Additionally, all dimensions of the device must be scaled simultaneously in order to optimize electrical performance of a device.

SOI devices having a channel thickness of about 50.0 nm or less are a promising option to further continue SOI CMOS device scaling. Thin channel SOI devices provide a sharper-sub-threshold slope (measure of the abruptness of the switching of the device), high mobility (because the device is operated at a lower effective field) and better short channel effect control.

A disadvantage of thin channel devices is that as the silicon-on-insulator (SOI) film is thinned the series resistance increases. Therefore, in order to overcome increasing series resistance of prior art thin channel devices, raised source/drain regions (RSD) must be utilized. Raised source/drain regions typically degrade manufacturing yield and also increase parasitic capacitance, which causes degradation in circuit performance. Additionally, raised source/drain regions are formed by an epitaxial growth process which typically requires a clean surface having a substantial crystalline structure.

In some prior art thin Si-channel devices, source/drain extension regions are implanted prior to raised source/drain formation resulting in a number of disadvantageous effects. For example, p-type extension regions require a thick offset spacer to control dopant diffusion and disadvantageously result in a high resistance region formed underlying the thick offset spacer. Additionally, in some prior art thin channel devices, the extension implants are conducted prior to raised source/drain formation; therefore subjecting the extension implant dopants to the significant thermal budget of the raised source/drain process, which may result in unwanted dopant diffusion. Further, the incubation time is different for p-type and n-type doped Si leading to substantially different raised source/drain thickness for p-type and n-type doped regions.

In one prior art thin Si channel device, a wide disposable spacer is utilized to grow the raised source/drain regions. High-energy implants are then performed to form deep source/drain regions. Following the high-energy implant, the wide disposable spacer is removed and extension regions are implanted. This prior art process overcomes excessive extension dopant diffusion and the epitaxial Si growth rate differential between p-type and n-type regions, but does not overcome the formation of high resistance regions outside the raised source/drain area, which are key to the performance of thin SOI MOSFETs. The formation of high resistance regions outside the raised source/drain area is also cost ineffective. In addition, the raised source drain regions cause increased parasitic capacitance, which slows down circuit performance.

Another prior art scheme utilizes a dummy structure as an implant mask for implanting oxygen ions into a bulk Si substrate. This process simultaneously creates a buried oxide layer and also forms a thin Si region; the thin Si region is produced by the dummy structure. However, in order to create a suitably thick buried oxide layer, a high-energy oxygen implant is needed. The large energy distribution of the high-energy implant required to form a suitably thick buried oxide layer disadvantageously results in a substantially wide region of thin Si that is much larger, in a lateral direction, than the desired width of the channel region. The lateral spread of the oxygen implant is proportional to the implant depth. Specifically, the lateral spread for oxygen implants conducted through gate structures into substrates utilized in conventional semiconducting devices is equal to $\frac{1}{3}$ the depth of the oxygen implant in the vertical direction. The lateral spread is also affected by the implant energy, where the greater the implant energy the greater the lateral spread.

Referring to FIG. 1, when using the prior art method in order to produce a low junction capacitance SOI device in a bulk Si substrate 37, a buried oxide layer 36 having a vertical thickness $T_5$ on the order of 200.0 nm must be formed as well as an SOI layer 35 having a thickness $T_2$ on the order of about 70 nm. Taking into account the vertical spread of oxygen dopant, in order to form a thinned channel region 26 underlying the dummy gate region 18, while simultaneously forming a suitable buried oxide region 36, the oxygen implant peak must extend through the dummy gate 18 ($T_4$=70.0 nm); through the desired thickness of the thin channel 26 ($T_1$=20.0 nm) and extend to a depth equal to half the thickness of the desired buried oxide 36 thickness ($T_3$=½(200.0 nm)). In the present example, the required peak implant depth to produce a suitable buried oxide layer 36 is equal to:

$$20.0 \text{ nm} + 70.0 \text{ nm} + \frac{1}{2}(200.0 \text{ nm}) = 190.0 \text{ nm}$$

As stated previously, the lateral spread of oxygen dopant $W_1$ is equivalent to $\frac{1}{3}$ the depth (vertical thickness) of the peak oxygen implant. Therefore, in the present example of the prior art the lateral spread of the oxygen dopant is on the order of about 60.0 nm. The lateral spread results in a channel region 26 that is not aligned with the edges of the overlying gate region 18, therefore producing thin silicon high resistance regions 40 at the terminal ends of the channel region 26 of the device. Additionally, the high-energy implant can produce defects and high levels of metallic contamination.

In view of the state of the art mentioned above, it would be highly desirable to provide a thin channel silicon-on-insulator device that overcomes the above-described disadvantages. More specifically, it would be highly desirable to provide thin channel silicon-on-insulator devices having low external resistance without raised source/drain regions. It would also be advantageous to provide an ultra-thin channel device with lower parasitic capacitance.

SUMMARY OF THE INVENTION

The present invention provides a thin channel SOI device having a low external resistance in which the channel region located in the SOI layer of an SOI substrate is effectively thinned by an underlying localized oxide region. In accordance with the present invention, the localized oxide region is self-aligned to an overlying gate region of the device. Specifically, the localized oxide region is positioned on and in contact with a uniform buried insulating layer of the silicon-on-insulator (SOI) substrate. The localized oxide region thins the channel region that is located in the SOI layer, i.e., the device layer, of the SOI substrate. The localized oxide region is produced using an oxygen implant and a dummy gate structure, where the energy of the oxygen implant and the height of the dummy gate are tailored to control the position of the localized oxide region.

Thinning the channel region with a localized oxide region allows for source/drain regions formed in the SOI layer to have a thickness sufficient to provide a low external resistance device. External resistance is the total resistance of the device outside the channel region. The present invention provides a low external resistance device having a resistance value less than about 400.0 Ohm/$\mu$m, with 200.0 Ohm/$\mu$m being preferred. Therefore, the present invention provides a low external resistance thin channel SOI device without requiring raised source/drain regions.

In broad terms, the present invention provides a semiconductor structure that comprises:

a channel region located in an SOI layer of an SOI substrate, wherein said channel region is thinned by the presence of an underlying localized oxide region that is located on top of and in contact with a buried insulating layer of said SOI substrate, said localized oxide region is self-aligned to a gate region that is located above said channel region.

Additionally, low resistance source/drain extensions are located in regions of the SOI layer of the SOI substrate that abut the channel region.

In more specific terms, the present invention provides a semiconductor structure that comprises:

a silicon-on-insulator structure comprising an SOI layer located atop a buried insulating layer, said SOI layer having a channel region which is thinned by the presence of an underlying localized oxide region that is located on top of and in contact with said buried insulating layer; and a gate region located atop said SOI layer, wherein said localized oxide region is self-aligned with the gate region.

Another aspect of the present invention relates to a method of forming the inventive thin channel SOI device. In broad terms, the inventive method comprises:

providing an SOI substrate having a buried insulating layer underlying an SOI layer;

forming a pad stack atop said SOI layer;

forming a dummy gate region atop said pad stack;

providing a localized oxide region that is located on top of and in contact with said buried insulating layer thereby thinning a portion of said SOI layer, said thinned portion of said SOI layer defining a channel;

forming source/drain extension regions in said SOI layer abutting said thinned portion of said SOI layer;

replacing said dummy gate region with a gate region, wherein said localized oxide region is self-aligned with said gate region.

The localized oxide region is formed by oxygen ion implantation and annealing. The implant forms a dopant profile in the SOI layer that lies beneath the dummy gate region. This dopant profile is converted into an oxide by the annealing step. In addition to forming a dopant profile in the SOI layer, the oxygen implant step also produces a dopant profile in the buried insulating layer of the SOI substrate in areas of the structure that are not underlying the dummy gate region. Dummy gate removal and formation of the gate region may further comprise forming a dielectric layer atop said substrate that is co-planar with the dummy gate region; etching the dummy gate region selective to the dielectric to expose the underlying pad stack; etching the pad stack selective to the channel region; forming a gate dielectric layer atop the channel region; and forming a gate conductor atop said gate dielectric layer.

One embodiment of the present invention overcomes the problems associated with the prior art by starting with an SOI wafer and forming a laterally abrupt localized oxide region in the device layer (hereafter referred to as the SOI layer) of the SOI wafer, where the localized oxide region is formed contacting an underlying buried oxide layer of the SOI wafer. In another embodiment of the present invention, the edges of the laterally abrupt localized oxide region correspond with the edges of the overlying gate region. The laterally abrupt localized oxide region is formed beginning with a low energy oxygen implant, where the low energy implant in conjunction with a dummy gate structure produce an oxygen dopant profile in a portion of the SOI layer. Thereafter, an anneal process converts the oxygen dopant into the localized oxide region. The localized oxide region contacts the buried oxide layer thinning a portion of the SOI layer that is aligned to the edges of an overlying gate region. The low energy implant produces a laterally abrupt localized oxide region that minimizes the extent of the thin Si outside the channel region. The term "laterally abrupt" is used in the present invention to denote a spread in the implant profile of less than 60.0 nm.

DETAILED DESCRIPTION

Figure 1:
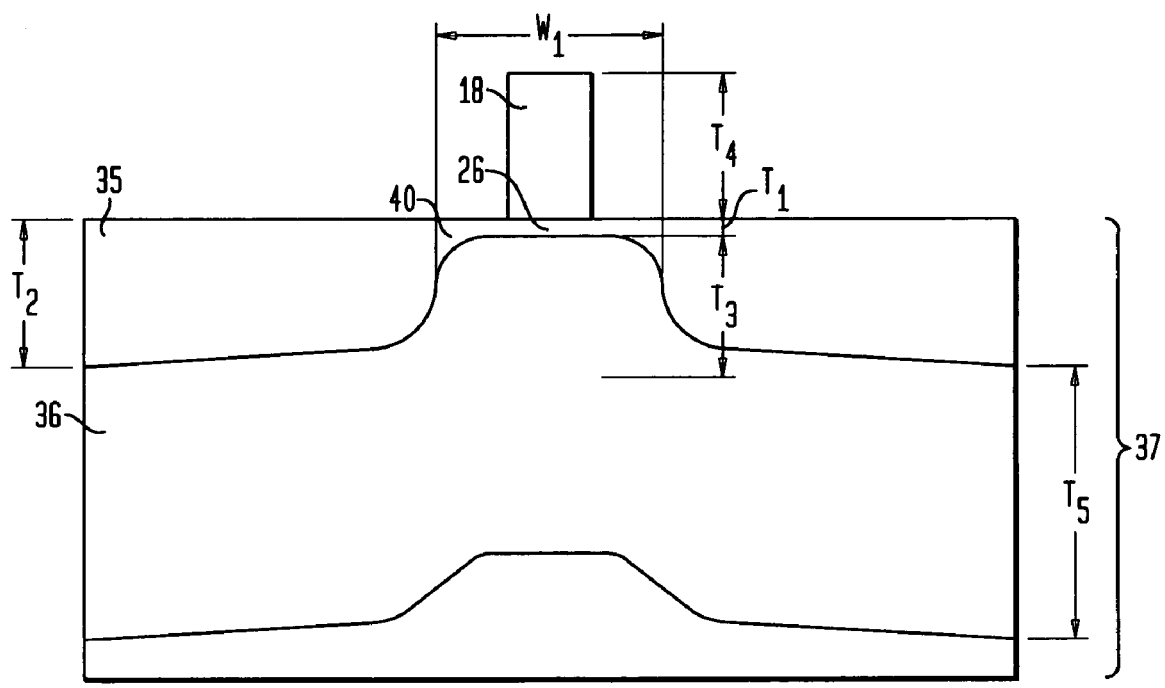
FIG. 1 is a pictorial representation (through a cross section view) of a prior art thin channel device formed on a bulk Si substrate.

The present invention provides a thin channel SOI MOSFET having low resistance source/drain regions 24 formed in the SOI layer 14 of a silicon-on-insulator (SOI) substrate 9. The thickness $T_1$ of the thin channel region 26 of the present invention is on the order of less than about 50.0 nm, preferably ranging from approximately 3.0 nm to approximately 30.0 nm.

The inventive thin channel MOSFET further comprises a localized oxide region 25 self-aligned to an overlying gate region, where the localized oxide region 25 in conjunction with the buried insulating layer 13 of the SOI substrate 9 effectively thin the device channel 26 while allowing for the formation of source/drain extensions 24 having a thickness equal to the thickness of the SOI layer 14 of the substrate. The present invention also provides a method for forming thin channel SOI devices where a dummy gate region 23 in conjunction with an oxygen implant 40 form the localized oxide region 25 that effectively thins the channel region 26 of the device. The present invention will now be described in more detail referring to the drawings that accompany the present application.

Figure 2:
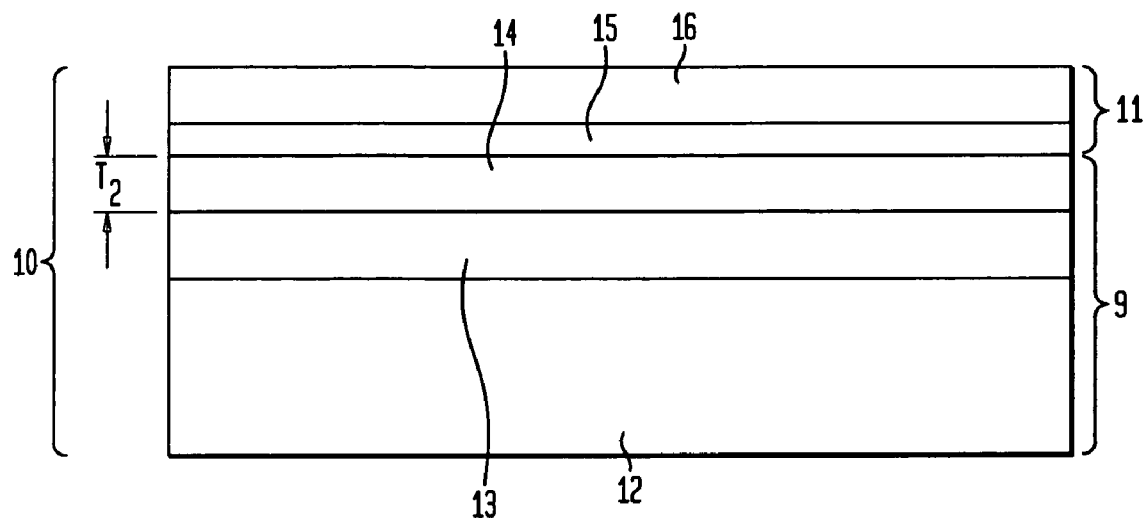
FIG. 2 is a pictorial representation (through a cross section view) of the initial structure of the present invention.

Reference is first made to FIG. 2, which illustrates an initial structure 10 that can be employed in the present invention including a pad stack 11 atop an SOI substrate 9. Specifically, the SOI substrate 9 comprises bottom bulk Si-containing layer 12, buried insulating layer 13 present atop the bottom bulk Si-containing layer 12, and top Si-containing layer (i.e., the SOI layer) 14 present atop the surface of the buried insulating layer 13.

The term "Si-containing layer" as used herein denotes any semiconducting material that includes silicon. Illustrative examples of various Si semiconductor materials that can be employed in the present include, but are not limited to: Si, SiGe, SiGeC, SiC and other like Si-containing materials. Combinations of the aforementioned Si semiconductor materials can also be used as the Si-containing layers of the SOI substrate. The top Si-containing layer (hereinafter referred to as the SOI layer) 14 may have a thickness $T_2$ ranging from approximately 20.0 nm to approximately 70.0 nm. The buried insulating layer 13 is typically a buried oxide region, which may have a thickness ranging from about 150.0 nm to about 200.0 nm. The thickness of the bulk Si-containing layer 12 is not critical to the present invention.

The SOI substrate 9 shown in FIG. 2 is fabricated using techniques well known to those skilled in the art. For example, the SOI substrate 9 may be formed by a thermal bonding process, or alternatively, the SOI structure 9 may be formed by an oxygen implantation process, which is referred to in the art as a separation by implantation of oxygen (SIMOX).

The pad stack 11 is then formed atop the SOI substrate 9 following conventional wafer cleaning process steps, using techniques well known to those skilled in the art. The cleaning process steps may include a cleaning mixture comprising ammonium hydroxide, hydrogen peroxide and deionized water or a cleaning mixture comprising hydrochloric acid, hydrogen peroxide, and deionized water.

Pad stack 11 may comprise pad oxide layer 15 and pad nitride layer 16. Pad oxide layer 15 can be formed by thermal oxidation or a conventional deposition process such as, chemical vapor deposition, room temperature chemical vapor deposition, plasma enhanced chemical vapor deposition, or chemical solution deposition. Pad oxide layer 15 may have a thickness ranging from about 2.0 nm to about 10.0 nm. Following pad oxide layer 15 formation, pad nitride layer 16 may be formed using conventional deposition processes, including but not limited to: chemical vapor deposition, or plasma enhanced chemical vapor deposition. The pad nitride layer 16 may comprise a conventional nitride, such as $Si_3N_4$, and may have a thickness ranging from about 50.0 nm to about 150.0 nm.

Although illustration is provided for a pad stack that has two layers. The present invention works in cases wherein pad stack 11 comprises a single layer or more than two layers.

Figure 3:
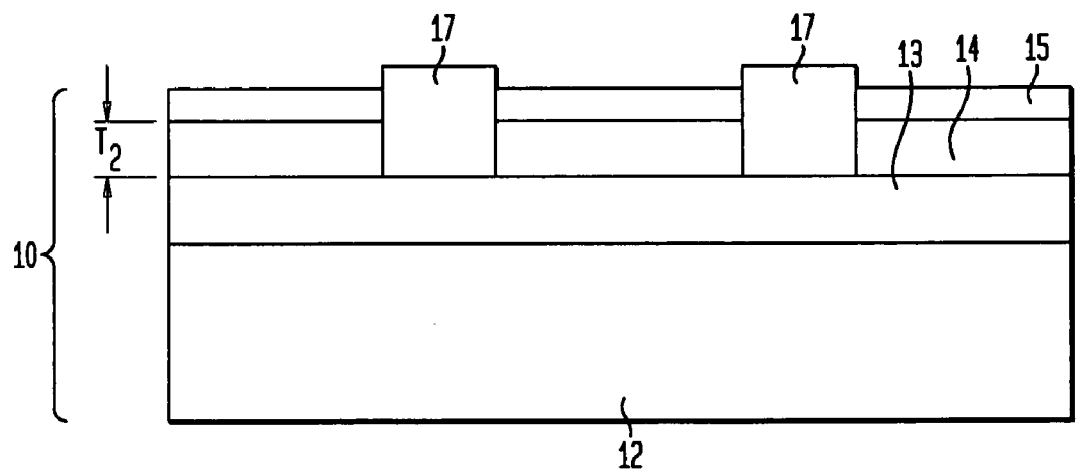
FIG. 3 is a pictorial representation (through a cross sectional view) of the structure of FIG. 2 further including isolation regions.

Referring now to FIG. 3, isolation regions 17 are then formed in the initial structure 10. Isolation regions 17 may be shallow trench isolation (STI) regions formed by etching a trench through the pad nitride layer 16, pad oxide layer 15 and SOI layer 14 to contact the buried insulating layer 13. The etching step may be performed utilizing a conventional dry etching process such as reactive-ion etching, ion beam etching, laser ablation or any combination thereof. A single etching process may be employed, or alternatively, more than one etching process may be employed to form trenches in the SOI structure.

The trenches may optionally be lined with a conventional liner material, e.g., $SiO_2$ or $Si_3N_4$, using thermal oxidation or nitridation. The optional liner may have a thickness of less than about 10.0 nm. CVD or another like deposition process can be used to fill the trench with an STI dielectric material such as a high-density plasma (HDP) oxide or TEOS (tetraethylorthosilicate).

The STI dielectric may optionally be densified after deposition. Following, densification the STI dielectric may be recessed using an HF wet etch. Alternatively, a conventional planarization process such as chemical-mechanical polishing (CMP) may be used to provide a planar structure.

The isolation region 17 may alternatively be formed by local oxidation (LOCOS) or by an oxide mesa formation process both of which are well known to those skilled in the art.

The pad nitride layer 16 is then typically removed using a hot phosphoric etch process. The nitride layer 16 may alternatively be removed using another conventional etch process in which the etch chemistry is selective to oxide pad layer 15.

Figure 4:
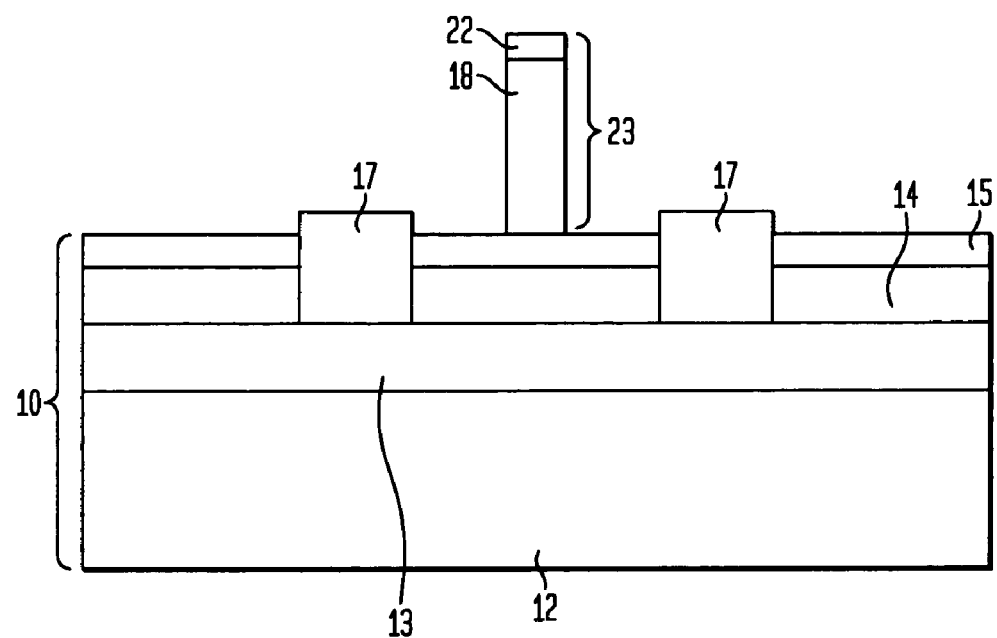
FIG. 4 is a pictorial representation (through a cross sectional view) depicting FIG. 3 further including dummy gate regions.

Now referring to FIG. 4, a dummy gate (i.e., a sacrificial gate) region 23 is next formed atop the oxide pad layer 15. The dummy gate region 23 is formed by first blanket depositing a layer of a sacrificial material 18 followed by deposition of a cap layer 22. The sacrificial material 18 may have a layer thickness ranging from approximately 40.0 nm to approximately 80.0 nm and may comprise polysilicon or another like material that can be selectively etched during a subsequent etching process. The cap layer 22 may have a thickness on the order of approximately 50.0 nm and may comprise an oxide, nitride, oxynitride or any combination thereof. In one embodiment of the present invention, cap layer 22 is composed of a nitride such as $Si_3N_4$.

Following blanket deposition of sacrificial material 18, the dummy gate region 23 is then formed using conventional photolithography and etching. More specifically, a pattern is produced by applying a photoresist to the surface to be etched; exposing the photoresist to a pattern of radiation; and then developing the pattern into the photoresist utilizing a conventional resist developer. Once the patterning of the photoresist is completed, the sections covered by the photoresist are protected while the exposed regions are removed using a selective etching process that removes the unprotected regions. In one embodiment of the present invention, a gate stack etching process utilizing HBr etch chemistries is used to remove the unprotected portions of the cap layer 22 and the sacrificial material 18 selective to the underlying pad oxide layer 15. In a preferred embodiment, the sacrificial gate material 18 is polysilicon and the patterned resist is removed using an $O_2$ ash process. Alternatively, the patterned resist may be stripped using a wet chemical process. The resultant dummy gate region 23 comprising sacrificial material 18 and cap layer 22 is depicted in FIG. 4.

Despite showing the presence of a single dummy gate region, the present invention also contemplates forming a plurality of such dummy gate regions across the entire structure.

Figure 5:
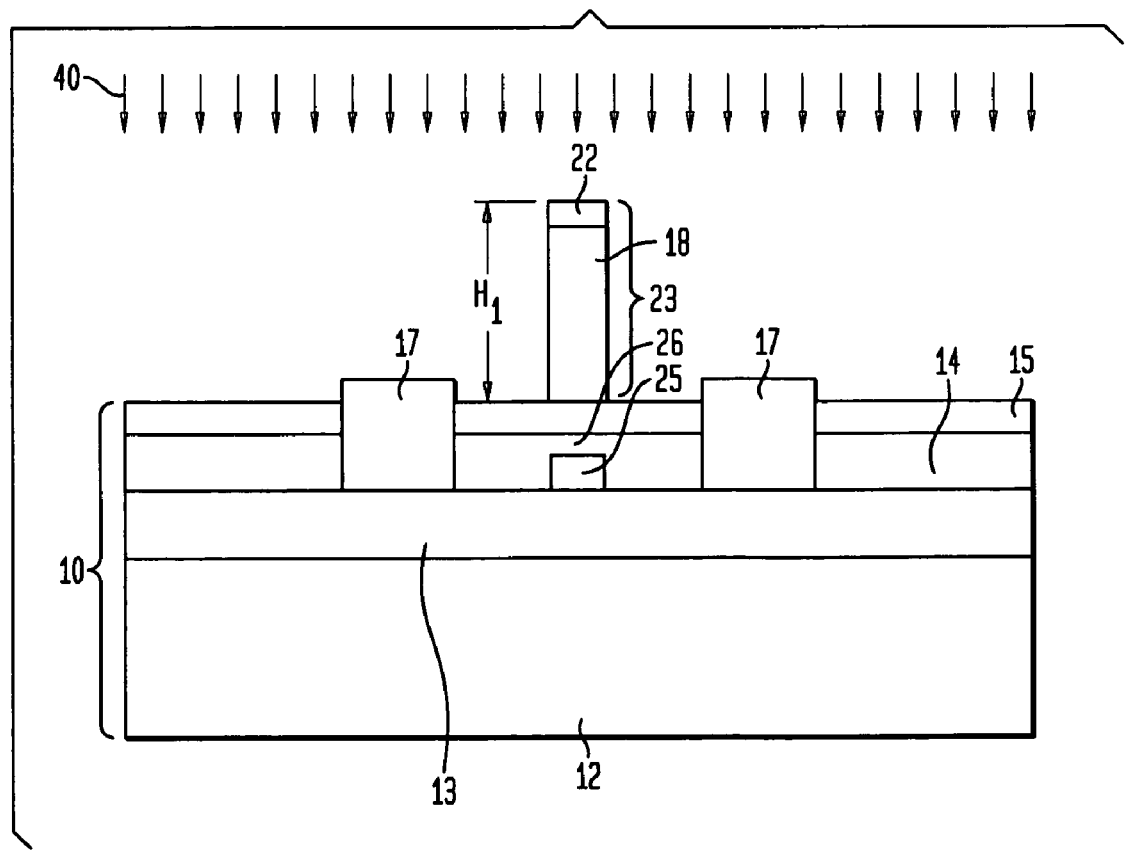
FIG. 5 is a pictorial representation (through a cross sectional view) of the structure of FIG. 4, further including oxygen implant to form the localized oxide region.

Turning now to FIG. 5, an oxygen implant 40 is then conducted using an implant energy and implant dose to produce an oxygen dopant profile 25 underlying and self-aligned to the dummy gate region 23. Positioning of the oxygen dopant profile 25 is a function of implant energy, implant dosage, and dummy gate region height $H_1$. By adjusting the implant energy, implant dosage and dummy gate region height $H_1$, the positioning of the dopant profile 25 may be tailored to produce a thinned channel region 26 self-aligned to the overlying gate region. In the present invention, the oxygen implant may be conducted to thin the channel 26 of the device. By implanting oxygen dopants into pre-manufactured SOI substrates 9, the implant depth and implant energy may be reduced in order to decrease the lateral spread of the dopants.

Figure 6:
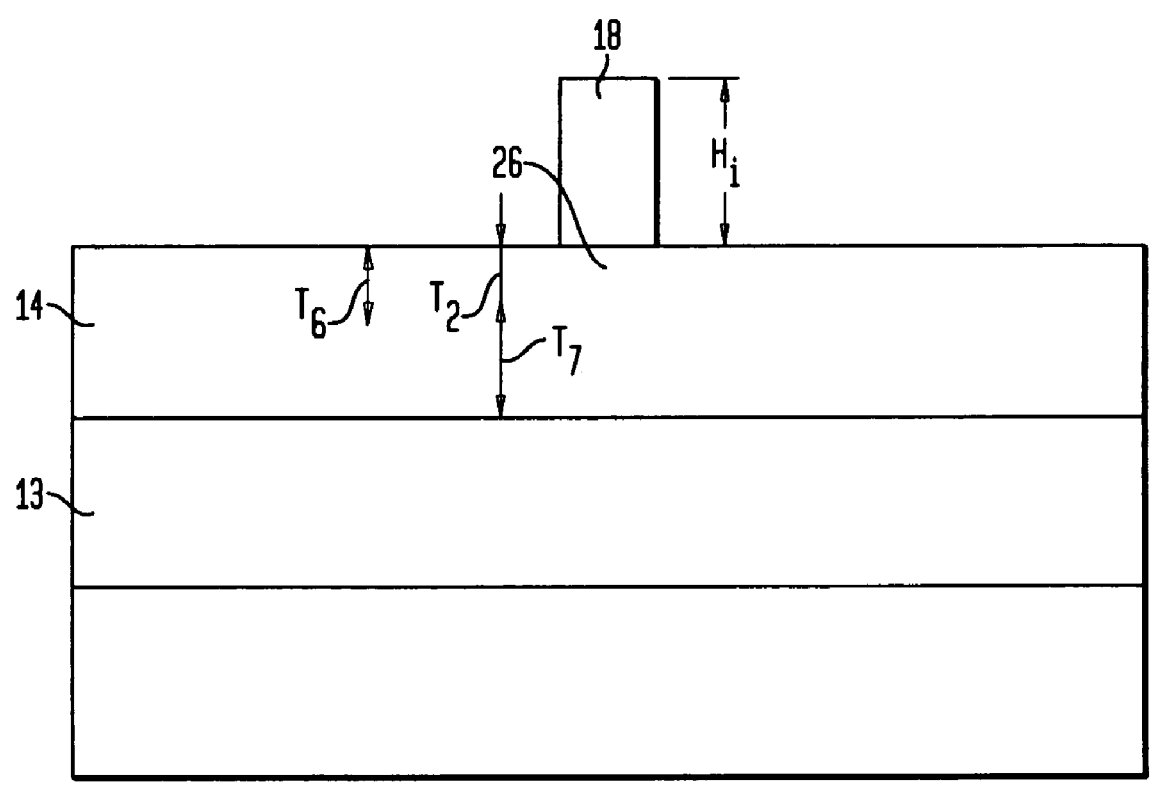
FIG. 6 is a pictorial representation (through a cross sectional view) of the oxygen dopant implant profile.

In one example, depicted in FIG. 6, in order to provide a 20.0 nm thin channel region 26 in a SOI layer 14, having a thickness $T_2$ on the order of about 70.0 nm, oxygen dopants may be implanted through a dummy gate region 18, having a 70.0 nm height $H_1$. The oxygen dopants are implanted into the underlying substrate, where the peak of the implant $T_6$ is about 115.0 nm from the top of the dummy gate region 18. The oxygen dopants produce a 50.0 nm thick oxygen dopant profile $T_7$, which contacts the buried oxide layer 13 and effectively thins the channel region to approximately 20.0 nm.

The required peak implant depth is equal to the height of the dummy gate region ($H_1$), the desired channel thickness ($T_2$), and the desired thickness of the oxide dopant region, taking into account the vertical spread of the dopant implant. More specifically, the implant peak must extend through the dummy gate region ($H_1=70.0$ nm); through the desired channel thickness ($T_2=20.0$ m); and through approximately half the desired thickness of the oxide dopant region ($T_7=$ ½(50.0 nm)), where the vertical spread of the implanted dopant forms an oxygen dopant profile contacting the buried oxide layer 13, while thinning the channel region 26. Therefore, in this example the implant peak depth $T_6$ is equal to 115.0 nm, as exemplified below:

70.0 nm+20.0 nm+½(50.0 nm)=115.0 nm

The lateral spread of the oxide dopant is about ⅓ the depth of the implant peak. Therefore, in the present example the lateral spread of the oxygen dopant is limited to approximately 35.0 nm. The limited lateral spread of the oxygen dopant reduces the amount of thin Si outside the channel region of the device; decreasing the production of high resistance regions existing at the terminal ends of the channel region, as formed in prior art methods. Compared to thin channel MOSFETs formed using conventional methods, having an oxygen dopant lateral spread greater than 60.0 nm, the present invention increases MOSFET drive current by approximately 25%. Therefore, the inventive method significantly increases drive current and device performance.

Additionally, by limiting the lateral spread of the oxygen dopant a thin channel 26 is provided having edges substantially aligned to the edges of the subsequently formed overlying gate. The present invention should not be limited the dimensions disclosed in the above example, since the above example was included for illustrative purposes only.

In accordance with the present invention, oxygen is also implanted into regions of the SOI substrate not underlying the dummy gate region 23. Therefore, the remaining portion of the oxygen implants, which are not implanted through the dummy gate region 23, produce a dopant profile that is present in buried insulating layer 13.

The oxygen implant may comprise a base oxygen implant having an ion dosage of about $8\times10^{16}$ cm$^{-2}$ or greater, with an ion dosage from about $8\times10^{16}$ cm$^{-2}$ to about $3\times10^{17}$ cm$^{-2}$ being more preferred. Oxygen implantation is typically carried out in an ion implantation apparatus that operates at a beam current density of from about 0.05 mA cm$^{-2}$ to about 500.0 mA cm$^{-2}$ at energy from about 30.0 keV to about 60.0 keV. A beam current density from about 50.0 mA cm$^{-2}$ to about 10.0 mA cm$^{-2}$ is more typically used in the present invention.

This base implant is carried out at a temperature from about 200° C. to about 800° C. More preferably, the base ion implant may be carried out at a temperature from about 200° C. to about 600° C.

The oxygen implant may further comprise a room temperature or second ion implant. The term "room temperature implant" as used herein for this embodiment of the present invention denotes an ion dose of about $1\times10^{14}$ cm$^{-2}$ to about $1\times10^{16}$ cm$^{-2}$, with an ion dose from about $1\times10^{15}$ cm$^{-2}$ to about $4\times10^{15}$ cm$^{-2}$ being more highly preferred. The second ion implant is carried out at an energy from about 15.0 keV or greater, with an energy of from about 15.0 keV to about 60.0 keV being more preferred. This second implant is performed at a temperature from about 4° C. to about 200° C. with a beam current density from about 0.05 mA cm$^{-2}$ to about 10.0 mA cm$^{-2}$. More preferably, the second ion implant may be performed at a temperature from about 25° C. to about 100° C. with a beam current density from about 0.5 mA cm$^{-2}$ to about 5.0 mA cm$^{-2}$.

In a preferred embodiment, the oxygen implant forms a dopant profile 25 in the portions of the SOI layer 14 that produces a final structure having a localized oxide region 25 self-aligned to a functioning gate region 31 and contacting the underlying buried insulating layer 13 of the SOI substrate 9 in a manner that effectively thins the channel region 26 of the device. In one example, the above scenario may be achieved with a dummy gate region 23 height $H_1$ ranging from about 40.0 nm to about 80.0 nm, preferably 100.0 nm; an oxide pad layer 15 thickness ranging from about 2.0 nm to about 10.0 nm, preferably 5.0 nm; a SOI 14 thickness ranging from about 20.0 nm to about 100.0 nm, preferably 70.0 nm; an oxygen dopant concentration ranging from about $8\times10^{16}$ cm$^{-2}$ to about $3\times10^{17}$ cm$^{-2}$; and a oxygen implant energy ranging from about 30.0 keV to about 60.0 keV.

Referring to FIG. 5, following the implantation the structure is next annealed for sufficient time and temperature to form the localized oxidation region 25, where said localized oxidation region 25 is positioned in the top Si-containing layer 14 contacting the underlying buried insulating layer 13 and is self-aligned to the overlying dummy gate region 23.

Specifically, the annealing step of the present invention is performed at a high temperature from about 900° C. to about 1350° C., with a temperature from about 1200° C. to about 1335° C. being more highly preferred. Moreover, the annealing step of the present invention is carried out in an oxidizing ambient that includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The annealing step may be carried out for a variable period of time that typically ranges from about 10 to about 1800 minutes, with a time period from about 60 to about 600 minutes being more highly preferred. The annealing step may be carried out at a single targeted temperature, or various ramp and soak cycles using various ramp rates and soak cycles can be employed.

During the annealing, the implant oxygen profile is converted to an oxide that may comprise a thermal oxide and/or implant oxide. In regions underlying the dummy gate region, the oxide forms a localized oxide layer that effectively thins portions of the overlying SOI layer. In regions outside the dummy gate region, the oxide forms into the buried insulating layer. The localized buried oxide is formed on top of and in contact with the buried insulating layer. As such, the insulating material underneath the dummy gate region is thicker than the insulating material not underneath the dummy gate region.

One aspect of the present invention is that by utilizing the dummy gate 23 in conjunction with the implant 40, the Si-containing layer 14 is thinned in a localized region 25 underlying and self-aligned to the dummy gate region 23. Therefore, since the dummy gate region 23 is later replaced with a functioning gate region 31, the thin channel 26 is self-aligned to the functioning gate region 31.

Additionally, thinning the channel region 26 with a localized oxide region 25 extending from an underlying insulator layer 13 allows for source/drain regions to be formed in regions of the Si-containing layer 14 having a thickness sufficient to provide a low external resistance. Therefore, the present invention does not require raised source/drain regions to produce a low resistance contact.

Figure 7:
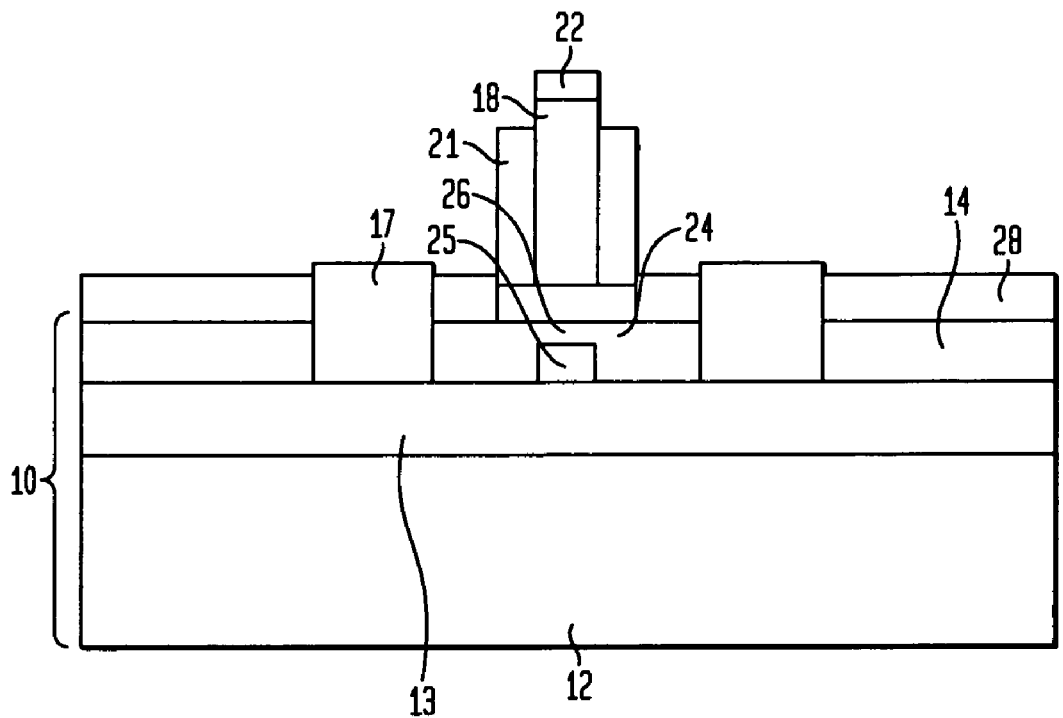
FIG. 7 is a pictorial representation (through a cross sectional view) of the structure shown in FIG. 5 further comprising spacer formation.

Referring to FIG. 7, following the formation of the localized oxidation region 25, spacers 21 are formed abutting the dummy gate region 23 and extension region dopants are implanted into the SOI 14. The spacers 21 are composed of any dielectric material such as, for example, an oxide, nitride, oxynitride or any combination thereof. Thus, the present invention contemplates single spacers or multiple spacers.

The spacers 21 may be formed prior to implantation to ensure that the dopant species does not diffuse into the channel region 26 of the device. Spacers 21 are formed using conventional deposition and etching. Spacers 21 may have a width ranging from about 2.0 nm to about 30.0 nm.

Following spacer 21 formation, the exposed portions of the pad oxide 15 are removed using a wet clean process selective to removing oxides. A remaining portion of the pad oxide 15 underlies the spacers 21 and dummy gates 23, where the remaining portion is protected during the wet cleaning process. The wet clean process may be comprised of a HF etching composition. During pad oxide 15 removal, a portion of the isolation regions 17 may also be recessed.

Extension regions 24 are then formed into the SOI layer using a conventional ion implantation process. P-type extension regions are typically produced with group III-A elements and n-type extension regions are typically produced with group V elements. In the case of the p-type implants, a typical impurity species is boron or $BF_2$. Boron with an energy of about 0.2 keV to about 3.0 keV or $BF_2$ with an energy of about 1.0 keV to about 15.0 keV and a dose of about $5 \times 10^{13}$ atoms/cm$^2$ to about $3 \times 10^{16}$ atoms/cm$^2$ can be used to implant the p-type region. A typical implant for the n-type regions is arsenic. The n-type regions can be implanted with arsenic using an energy of about 0.25 keV to 5.0 keV with a dose of about $3 \times 10^{13}$ atoms/cm$^2$ to about $3 \times 10^{16}$ atoms/cm$^2$.

Although the present invention has been depicted using a single device for the purposes of clarity, multiple devices may be processed on a single substrate using conventional patterning techniques well known within the skill of the art. Regions of the substrate may be selectively implanted by employing layers of photoresist and then patterning the layers of photoresist through photolithography.

More specifically, a layer of photoresist is deposited atop the entire structure. The photoresist layer may be comprised of dielectrics including carbon, oxygen, and various inorganic metals. The photoresist layer is then selectively patterned and developed to form a block mask, protecting at least one first region of the substrate and exposing at least one second region of the substrate. The exposed regions of the device are then implanted while the regions underlying the block mask are protected. Following processing of the first region, the block mask is removed by conventional stripping techniques. Another block mask may be formed and utilized as described above for processing another region of the substrate. Therefore, substrates having multiple device regions are within the scope of the present invention.

Additionally, when processing multiple regions with different implant species a set of offset spacers (not shown) may be formed adjacent to the spacers 21, where the additional offset spacers act as an independent adjustment to compensate for dopant species having higher diffusivity. For example, boron has a higher diffusivity than arsenic. Therefore, the additional offset spacers may be incorporated into regions implanted with boron to compensate for the difference in diffusion rates between the regions implanted with boron as opposed to regions implanted with lower diffusivity dopants such as arsenic.

Following extension region implant, source-drain spacers are formed by depositing a conformal film like SiN for example and next removing the SiN from the horizontal surfaces using a highly directional dry etch process. After source-drain implantation, typically arsenic or phosphorus for nFETs and boron for pFETs, the junctions are activated by an annealing process including but not limited to rapid thermal anneal. The rapid thermal annealing temperature is carried out using a temperature of 750° C. to about 1200° C. for a time period of about 1.0 second to about 20 seconds.

Still referring to FIG. 7, silicide regions 28 are then formed atop the extension regions 24. Silicide 28 formation typically requires depositing a silicide metal such as Ni, Co, W, Pt or Ti (and alloys thereof) onto the exposed surfaces of the SOI layer 14. A pre-clean may be performed prior to metal deposition to remove residual oxide and other contamination from the regions of the SOI layer 14 on which the silicide regions 28 are formed using a wet cleaning process. Following metal deposition, the structure is then subjected to an annealing step using conventional processes such as, but not limited to, rapid thermal annealing. During thermal annealing, the deposited metal reacts with Si forming a metal silicide.

Figure 8:
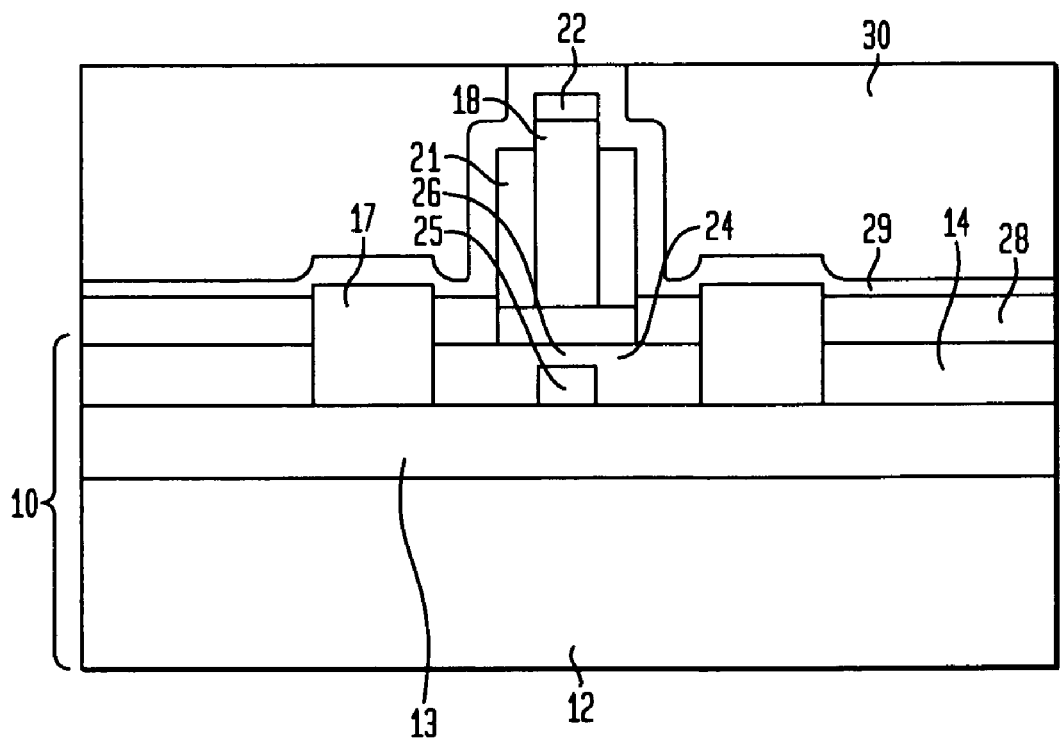
FIG. 8 is a pictorial representation (through a cross sectional view) of the structure shown in FIG. 7, further including the deposition of a liner material and planarized dielectric layer atop the structure shown in FIG. 7.

Now referring to FIG. 8, a conformal liner 29 is deposited atop the substrate, including the dummy gate region 23, using conventional deposition processes, including but not limited to: chemical vapor deposition, low pressure chemical vapor deposition, and plasma enhanced deposition. Alternatively, the conform liner 29 may be grown using a thermal growth process. The conformal liner 29 may comprise a dielectric material such as an oxide, nitride, oxynitride or combinations thereof. Preferably, the conformal liner 29 is a nitride. In a next process step, a layer dielectric material 30 such as a high density plasma oxide, is deposited atop the entire substrate and planarized by chemical mechanical polishing (CMP) or like process until the upper most portion of the conformal layer 29 is exposed, which is positioned atop the gate region 23. Alternatively, a spin-on-dielectric or layer of photoresist may be used instead of a high-density plasma oxide.

Figure 9:
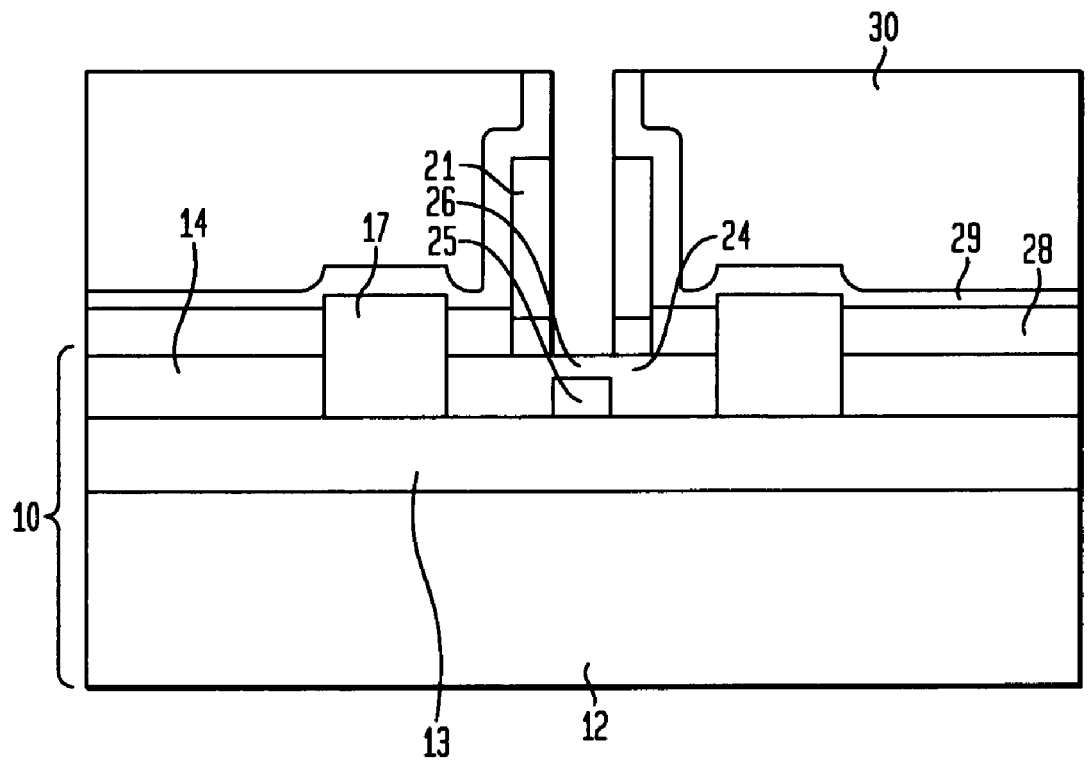
FIG. 9 is a pictorial representation (through a cross sectional view) of the structure shown in FIG. 8 following selective etch process steps to remove the dummy gate.

Following planarization, a portion of the conformal liner 29 and dummy gate region 23 are removed by one or more etching steps. First, the upper portion of the conformal liner 29 and the cap 22 are removed by a wet or dry etch process, which is selective to the dielectric material 30. The sacrificial material 18 is then removed by an etch process capable of etching the sacrificial material 18 selective to the planarized dielectric 30 and spacers 21. Preferably, sacrificial material 18 is removed using chemical deposition etching or KOH stopping atop the pad oxide layer 15. The resultant structure following dummy gate removal 23 is depicted in FIG. 9.

A pre-gate oxide surface preparation step follows dummy gate region 23 removal. The pre-gate oxide surface preparation may include a chemical oxide removal (COR) process that is carried out at relatively low pressures (6 milli-torr or less) in a vapor of HF and $NH_3$ and removes a portion of the pad oxide layer 15 without damaging the underlying channel region 26. Alternatively, the pad oxide layer 15 may be removed using dry etch processes, including but not limited to: reactive ion etch and high density plasma etch. In order to ensure that the pad oxide layer 15 is removed without damaging the underlying SOI layer 14, the etch process may be timed or monitored using end point detection methods. A wet pre-clean consisting of a $NH_4OH$, $H_2O_2$ and $H_2O$ mixture followed by another wet cleaning step consisting of HCl, $H_2O_2$ and $H_2O$ and a final HF dip may also be done.

Next, gate dielectric 27 is formed atop the thinned device channel region 26 by a thermal oxidation, nitridation or oxynitridation process. Alternatively, gate dielectric 27 may be formed utilizing a deposition process. Combinations of the aforementioned processes may also be used in forming the gate dielectric 27. The gate dielectric 27 may be composed of any conventional dielectric including, but not limited to: $SiO_2$; $Si_3N_4$; SiON; temperature sensitive high-k dielectrics such as $TiO_2$, $Al_2O_3$, $ZrO_2$, $HfO_2$, $Ta_2O_5$, $La_2O_3$; and other like oxides including perovskite-type oxides. Gate dielectric 27 may also comprise any combination of the aforementioned dielectric materials. The gate dielectric 27 preferably has a thickness ranging from about 0.6 nm to about 5.0 nm.

Figure 10:
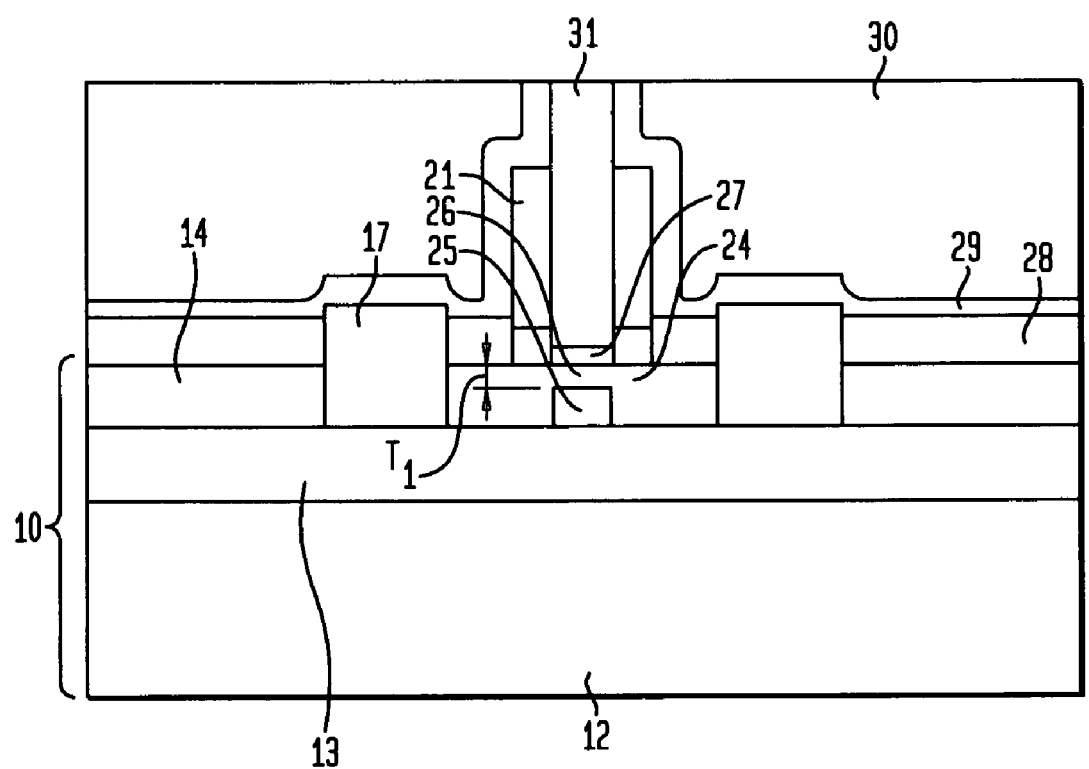
FIG. 10 is a pictorial representation (through a cross sectional view) of the structure shown in FIG. 9, further including the formation of a functioning gate electrode.

After gate dielectric 27 has been formed, gate conductor 31 is formed atop gate dielectric 27 by a conventional deposition process (such as CVD, plasma-assisted CVD, plating, sputtering and etc.) followed by planarization. Gate conductor 31 may comprise any conductive material including but not limited to: polysilicon; a conductive elemental metal such as W, Cu, Pt, Ag, Au, Ru, Ir, Rh, and Re; alloys that include at least one of the aforementioned conductive elemental metals; silicides or nitrides that include at least one of the above-mentioned conductive elemental metals; and combinations thereof may be employed. When a combination of conductive elements is employed, an optional diffusion barrier material such as TaN or WN may be formed between the conductive materials. The resultant structure that is formed after gate dielectric 27 and gate conductor 31 have been formed is shown, for example, in FIG. 10.

A highly preferred conductive material employed as gate conductor 31 is a mid-gap metal, W or TiN since these gate conductors lead to a fully-depleted MOSFET structure with a very low off-current. When a metal gate conductor is employed, the metal gate conductor is formed by deposition, planarization.

In some embodiments, normal BEOL processing may now be performed such as standard contact and wiring processes well known within the skill of the art.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described the invention in detail, what we claim as new and desire to secure by Letters Patent is:

1. A semiconducting device comprising:
   a channel region located in an SOI layer of an SOI substrate, wherein said channel region is thinned by the presence of an underlying localized oxide region that is located in said SOI layer and on top of and in contact with a buried insulating layer of said SOI substrate, said localized oxide region has outer edges that are aligned with outer edges of a gate region that is located above said channel region, said SOI layer is located atop said buried insulating layer, and said buried insulating layer has a uniform thickness.

2. The semiconducting device of claim 1 wherein said channel region has a thickness of less than approximately 50.0 mn.

3. The semiconducting device of claim 1 wherein said channel region has a thickness ranging from approximately 2.0 nm to approximately 25.0 nm.

4. The semiconducting device of claim 1 further comprising spacers abutting said overlying gate region.

5. The semiconducting device of claim 1 wherein said SOI layer further comprises source/drain extension regions abutting said channel region.

6. THe semiconducting device of claim 5 wherein said source/drain extension regions have a thickness ranging from about 30.0 nm to about 70.0 nm.

7. The semiconducting device of claim 5 wherein source/drain extension regions comrprise a doped region of sai SOI layer, wherin said doped region is doped with an n-type dopant or p-type dopant.

8. The semiconducting device of claim 5 further comprising silicide regions positioned on said source/drain extension regions.

9. The semiconducting device of claim 1 wherein said SOI layer comprises Si, SiGe, SiGeC, SiC or combinations thereof.

10. The semiconducting device of claim 1 wherein said localized oxide region has a thickness ranging from about 25.0 nm to about 65.0 nm.

11. The semiconductor device of claim 1, wherein said uried sinsulating layer has a uniform thickness ranging from about 150.0 nm to about 200.0 nm.

12. The semiconducting device of claim 1 wherein said localized oxide region comprises a thermal oxide, an implanted oxide, or a combination thereof.

13. The semiconducting device of claim 1 wherein said SOI layer further comprises isolation regions.

14. The semiconducting device of claim 1 having an external resistance ranging from about 200.0 Ohm/µm to about 400.0 Ohm/µm.

15. A semiconducting device comprising:

a silicon-on-insulator structure comprising an SOI layer located atop a buried insulating layer, said SOI layer having a channel region which is thinned by the presence of an underlying localized oxide region that is located in said SOI layer and on top of and in contact with said buried insulating layer said buried insulating layer having a uniform thickness; and a gate region located atop said SOI layer, wherein said localized oxide region has outer edges that are aligned with outer edges of the gate region.

* * * * *

UNITED STATES PATENT AND TRADEMARK OFFICE
CERTIFICATE OF CORRECTION

PATENT NO. : 7,075,150 B2  Page 1 of 1
APPLICATION NO. : 10/725849
DATED : July 11, 2006
INVENTOR(S) : Diane C. Boyd et al.

It is certified that error appears in the above-identified patent and that said Letters Patent is hereby corrected as shown below:

Column 12, Line 45,:
"50.0mn" should read -- 50.0 nm --

Column 12, Line 54,:
"THe semiconducting" should read -- The semiconducting --

Column 12, Line 58,:
"comrprise a doped region of sai SOI layer"

should read

-- comprise a doped region of said SOI layer --

Column 13, Line 5,:
"uried sinsulating" should read -- buried insulating --

Signed and Sealed this

Fourteenth Day of November, 2006

JON W. DUDAS
*Director of the United States Patent and Trademark Office*